US012213276B2

(12) United States Patent
Liu et al.

(10) Patent No.: US 12,213,276 B2
(45) Date of Patent: Jan. 28, 2025

(54) INTELLIGENT DYNAMIC AIR BAFFLE

(71) Applicant: Cisco Technology, Inc., San Jose, CA (US)

(72) Inventors: Chejung Liu, San Jose, CA (US); Ravinandana Mysore Ramachandra Rao, San Jose, CA (US); Vic Hong Chia, Sunnyvale, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 302 days.

(21) Appl. No.: 17/900,147

(22) Filed: Aug. 31, 2022

(65) Prior Publication Data
US 2024/0074093 A1 Feb. 29, 2024

(51) Int. Cl.
*H05K 7/20* (2006.01)
*F16K 31/00* (2006.01)
(Continued)

(52) U.S. Cl.
CPC ....... *H05K 7/20145* (2013.01); *G05D 7/0173* (2013.01); *G05D 23/025* (2013.01);
(Continued)

(58) Field of Classification Search
CPC .... G05D 23/025; G05D 23/02; F16K 31/002; H05K 7/20145; H05K 7/20181; H05K 7/20727
See application file for complete search history.

(56) References Cited

U.S. PATENT DOCUMENTS 4,497,241 A * 2/1985 Ohkata ............... F24F 13/1426
454/258
4,699,314 A * 10/1987 Faurie .................. F24F 13/072
236/49.5
(Continued)

FOREIGN PATENT DOCUMENTS

| EP | 3157054 A1 | 4/2017 |
| WO | 2017121111 A1 | 7/2017 |
| WO | 2021083493 A1 | 5/2021 |

OTHER PUBLICATIONS

MinebeaMisumi, "Fan Engineering", https://nmbtc.com/fan-engineering/, downloaded from Internet May 26, 2021, 2 pages.
(Continued)

Primary Examiner — Zachary Pape
(74) Attorney, Agent, or Firm — Edell, Shapiro & Finnan, LLC

(57) ABSTRACT

A dynamic air baffle comprises: spaced-apart first and second plates configured to be positioned adjacent to at least one heat source to be cooled by an airflow; a heat insulator sandwiched between the first and second plates; and an air flap coupled to the first and second plates and extending into the airflow; wherein the first and second plates are configured such that a differential temperature between the first and second plates causes a differential expansion in lengths of the first and second plates, which rotates the air flap from a rest position, corresponding to when the differential temperature is zero, to a rotated position that is closer to a cooler plate and farther from a hotter plate of the first and second plates, such that the air flap directs more of the airflow to the hotter plate and less of the airflow to the cooler plate.

20 Claims, 9 Drawing Sheets

(51) Int. Cl.
*G05D 7/01* (2006.01)
*G05D 23/02* (2006.01)

(52) U.S. Cl.
CPC ............ *F16K 31/002* (2013.01); *G05D 23/02* (2013.01); *H05K 7/20181* (2013.01)

(56) References Cited

U.S. PATENT DOCUMENTS

| | | | | |
|---|---|---|---|---|
| 5,186,385 | A * | 2/1993 | Karabin | G05D 23/08 |
| | | | | 236/1 G |
| 6,128,188 | A * | 10/2000 | Hanners | H01L 23/3735 |
| | | | | 174/16.3 |
| 6,330,155 | B1 * | 12/2001 | Remsburg | H05K 7/20154 |
| | | | | 236/49.5 |
| 8,301,316 | B2 * | 10/2012 | Tai | H05K 7/20727 |
| | | | | 700/282 |
| 8,385,066 | B2 * | 2/2013 | Chang | H05K 7/20727 |
| | | | | 361/679.48 |
| 8,422,227 | B2 * | 4/2013 | Lai | H05K 7/20727 |
| | | | | 361/695 |
| 9,247,673 | B2 * | 1/2016 | Kelaher | F04D 29/646 |
| 12,074,081 | B2 * | 8/2024 | Roemer | H01L 23/3736 |
| 2004/0256720 | A1 | 12/2004 | Yap et al. | |
| 2005/0121775 | A1 | 6/2005 | Fitzgerald et al. | |
| 2010/0097758 | A1 | 4/2010 | Franz et al. | |
| 2011/0128704 | A1 | 6/2011 | Chang et al. | |
| 2011/0184568 | A1 | 7/2011 | Tai et al. | |
| 2012/0127664 | A1 | 5/2012 | Shu | |
| 2012/0155021 | A1 | 6/2012 | Wei | |
| 2020/0229318 | A1 | 7/2020 | Grau et al. | |

OTHER PUBLICATIONS

Hao Tian, et al., "A new mathematical model for multi-scale thermal management of data centers using entransy theory", Building Simulation, https://link.springer.com/article/10.1007/s12273-018-0479-z, downloaded Nov. 1, 2018, 14 pages.

Engineered Materials Solutions, "Thermostatic Bimetal Designer's Guide", downloaded Mar. 21, 2016, 50 pages.

* cited by examiner

900

---

902 — PROVIDING A DYNAMIC AIR BAFFLE HAVING SPACED-APART PLATES CONFIGURED TO BE POSITIONED ADJACENT TO REGIONS/HEAT SOURCES TO BE COOLED BY AN AIRFLOW, A HEAT INSULATOR SANDWICHED BETWEEN THE PLATES, AND AN AIR FLAP FIXED TO ENDS OF THE PLATES AND EXTENDING INTO THE AIRFLOW

904 — BY THE DYNAMIC AIR BAFFLE, RESPONSIVE TO A NON-ZERO DIFFERENTIAL TEMPERATURE BETWEEN THE PLATES (WHICH IS CAUSED BY A NON-ZERO DIFFERENTIAL TEMPERATURE BETWEEN THE REGIONS) THAT CAUSES A NON-ZERO DIFFERENTIAL EXPANSION IN LENGTHS OF THE PLATES, ROTATING THE AIR FLAP FROM A REST POSITION, CORRESPONDING TO WHEN THE DIFFERENTIAL TEMPERATURE AND THE DIFFERENTIAL EXPANSION IN THE LENGTHS OF THE PLATES ARE BOTH ZERO, TO A ROTATED POSITION THAT IS CLOSER TO A COOLER REGION AND FARTHER FROM A HOTTER REGION OF THE REGIONS AND DIRECTING MORE OF THE AIRFLOW TO THE HOTTER REGION AND LESS OF THE AIRFLOW TO THE COOLER REGION COMPARED TO WHEN THE AIR FLAP IS IN THE REST POSITION

FIG.9

INTELLIGENT DYNAMIC AIR BAFFLE

TECHNICAL FIELD

The present disclosure relates to a dynamic air baffle for controlling airflow directed to one or more heat sources.

BACKGROUND

A heatsink coupled to an application specific integrated circuit (ASIC) on a printed circuit board (PCB) can become a temperature hot spot on the PCB when the ASIC is operating. A conventional fixed air baffle channels airflow induced by a fan to the hot spot; however, this arrangement is disadvantageously bulky and fixed in a location, hence the cubic feet per minute (CFM) of air directed to and through the heatsink is predefined. The PCB commonly employs dual or triple central processing units (CPUs)/ASICs to provide desired data processing power. In such an arrangement, the fixed air baffle may direct an equal amount of airflow or cooling to all CPU/ASICs/heat sources regardless of their actual, dynamically-varying, utilization and different temperatures. The fixed air baffle is highly inflexible and inefficient in an environment that attempts to controls fan speed versus ASIC temperature due to the static nature of the air baffle.

BRIEF DESCRIPTION OF THE DRAWINGS

FIG. 9 is a flowchart of a method of controlling airflow to one or more heat sources using the dynamic air baffle, according to an example embodiment.

DETAILED DESCRIPTION

Overview

In an embodiment, a dynamic air baffle comprises: first and second plates spaced-apart from each other and configured to be positioned adjacent to at least one heat source to be cooled by an airflow; a heat insulator sandwiched between the first and second plates; and an air flap coupled to ends of the first and second plates and configured to extend into the airflow to partition the airflow; wherein the first and second plates are configured such that a differential temperature between the first and second plates causes a differential expansion in lengths of the first and second plates, which rotates the air flap from a rest position, corresponding to when the differential temperature and the differential expansion in the lengths are both zero, to a rotated position that is closer to a cooler plate and farther from a hotter plate of the first and second plates, such that the air flap directs more of the airflow to the hotter plate and less of the airflow to the cooler plate compared to when the air flap is in the rest position.

Example Embodiments

Figure 1:
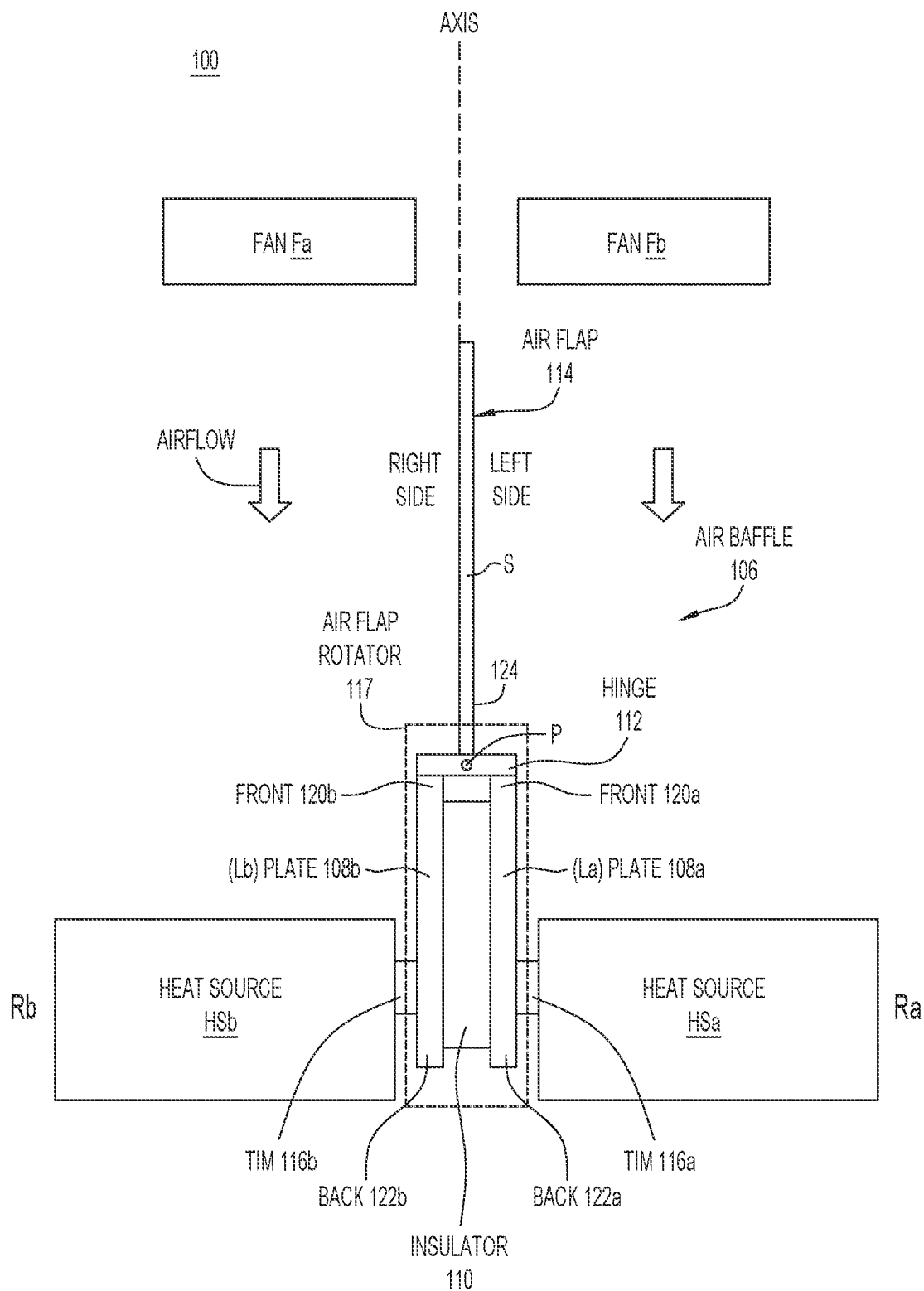
FIG. 1 is a high-level top-down view of an intelligent dynamic air baffle (also referred to simply as a "dynamic air baffle") configured to control airflow to opposing heat sources positioned adjacent to the dynamic air baffle when the heat sources are at the same temperature, according to an example embodiment.
Figure 2:
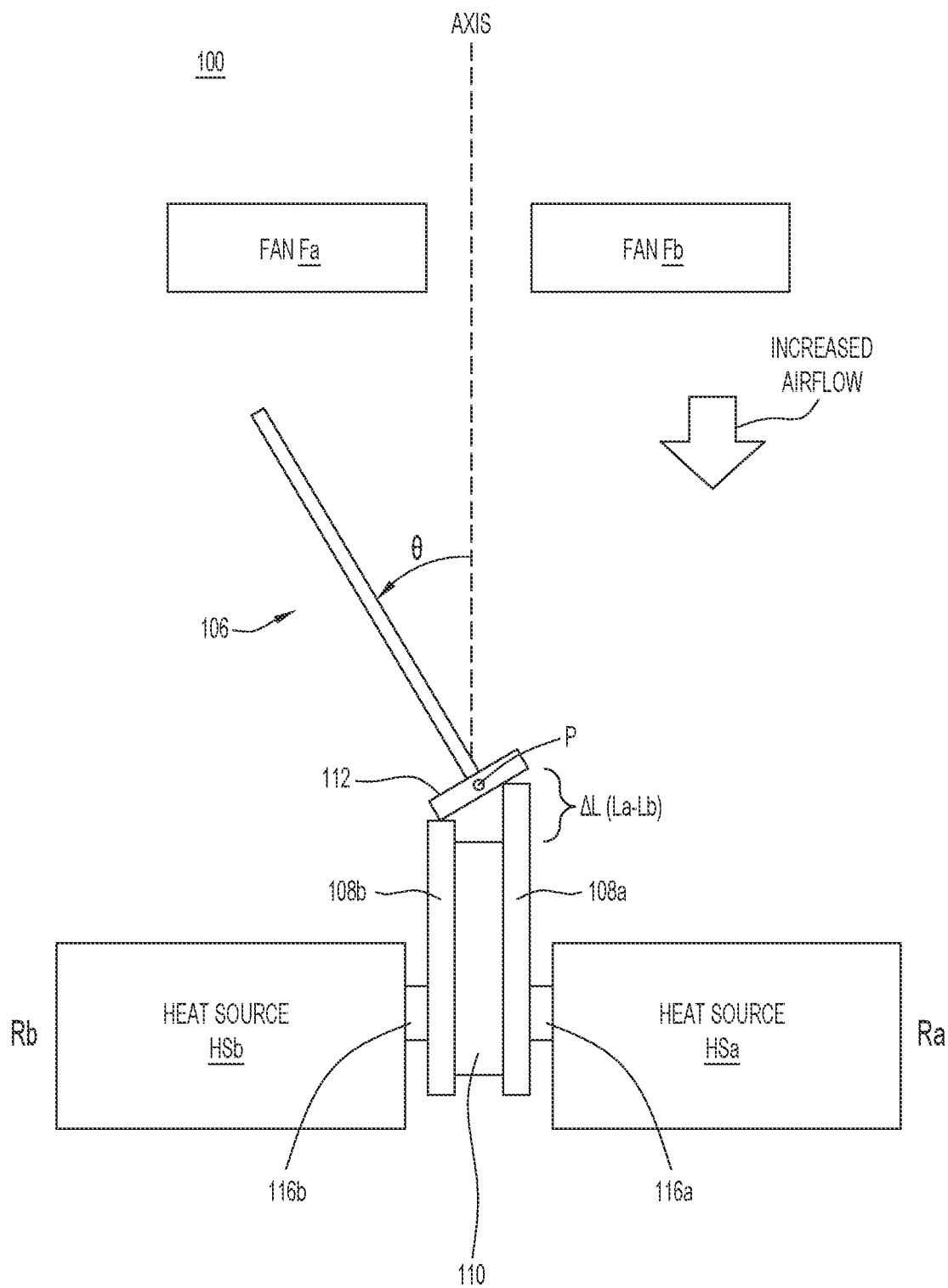
FIG. 2 is a high-level top-down view of the dynamic air baffle when the opposing heat sources are at different temperatures, according to an example embodiment.

FIGS. 1 and 2 are high-level top-down views of an example system 100 that includes left and right heat sources (HSs) HSa and HSb spaced apart from each other in a horizontal direction (e.g., a first direction), left and right fans Fa and Fb spaced apart from the heat sources in a vertical direction (e.g., a second direction transverse to the first direction) and configured to produce an airflow directed vertically downwards towards the heat sources, and an example intelligent dynamic air baffle 106 (referred to simply as a "dynamic air baffle 106") sandwiched between the heat sources and configured to control the airflow in accordance with embodiments presented herein. Left and right heat sources HSa and HSb may occupy respective left and right regions or volumes Ra and Rb on opposing sides of dynamic air baffle 106. Heat sources HSa and HSb may be respective heat sinks mounted to respective ASICs, for example. The ASICs generate substantial amounts of heat while operating, and thus drive dynamic temperatures of the heat sinks. Dynamic air baffle 106 and its operation will be described briefly in connection with FIGS. 1 and 2. Then, construction details of dynamic air baffle 106 will be described in connection with FIGS. 3-7.

Referring to FIG. 1, dynamic air baffle 106 includes a left plate 108a, a right plate 108b spaced apart from the left plate in the horizontal direction, a thermal/heat insulator 110 sandwiched between interior surfaces of the left and right plates, a hinge 112 fixed to/across front ends of the left and right plates, an air flap 114 fixed to the hinge, and left and right thermal interface material (TIM) elements 116a, 116b respectively fixed to exterior surfaces (that oppose the interior surfaces) of the left and right plates (which may also be referred to as "expansion plates"). As will be described below, hinge 112 and air flap 114 carried by the hinge are configured as rotatable elements of dynamic air baffle 106. In the ensuing description, the descriptors "left" and "right" may be dropped.

Plates 108a, 108b have respective horizontally-spaced vertical lengths La, Lb that extend from front ends 120a, 120b to back ends 122a, 122b of the plates. Plates 108a, 108b are parallel and coextensive with each other along their lengths La, Lb. Plates 108a, 108b may each be made of the same material, which has a relatively high thermal conductivity and a relatively high coefficient of thermal expansion (CTE), e.g., around 385 Watts (W)/meter (m)/Kelvin (K) (W/mK). Plates 108a, 108b may each be made from a common (i.e., the same) sheet metal, such as aluminum, copper, brass, or other suitable metal, for example. Due to the high CTE of plates 108a, 108b, the length (e.g., La or Lb) of each plate changes responsive to changes in the temperature of the plate over a relatively wide operating temperature range of dynamic air baffle 106 and heat sources HSa and HSb. For example, the length of a given plate expands and contracts responsive to an increase and a decrease in the temperature of the plate, respectively. Plates 108a, 108b are sized such that lengths La, Lb are equal when the plates are at the same temperature, but the lengths are different when the plates are at different temperatures. Therefore, a differential temperature (or temperature differential) between plates 108a, 108b causes a differential expansion in lengths La, Lb of the plates corresponding to the differential temperature.

As mentioned above, dynamic air baffle 106 further includes heat insulator 110 sandwiched between respective inner surfaces (i.e., opposing inner surfaces) of plates 108a, 108b, along a significant portion of lengths La, Lb of the plates. In contrast to plates 108a, 108b, heat insulator 110 is made of material that has a relatively low thermal conductivity and a relatively low CTE, e.g., approximately 0.032 W/mK, which are substantially less than the thermal conductivity and the CTE of plates 108a, 108b. Therefore, heat insulator 110 prevents or at least substantially reduces heat transfer between plates 108a, 108b. Heat insulator 110 may be made from glass, plastic, nylon, and the like, for example.

Dynamic air baffle 106 includes hinge 112 that extends across and is fixed to opposing front ends 120a, 120b of plates 108a, 108b. In turn, air flap 114 has a fixed end 124 fixed to a center portion of hinge 112, and a substantially planar rectangularly-shaped side or surface (S) (best seen in FIGS. 5-8) that extends away from the fixed end and into the airflow to partition the airflow between a left side and a right side of the air flap. Hinge 112 may be made from a suitable sheet or die-cast metal, similar to plates 108a, 108b, for example. Air flap 114 may be made of plastic or mylar, for example. Specific details of the hinge-plate coupling structure are described below in connection with FIGS. 4-7. In the example of FIG. 1, fans Fa, Fb force the airflow in a direction towards (i.e., at) dynamic air baffle 106, and the dynamic air baffle is oriented such that air flap 114 points in a direction opposite to the direction of the airflow, i.e., towards the fans.

Dynamic air baffle 106 further includes thermal interface (TIM) elements 116a, 116b fixed to outer surfaces of plates 108a, 108b, respectively. TIM elements 116a, 116b each comprise a material having a relatively high thermal conductivity. TIM elements 116a, 116b may be made from any suitable known TIM material. Plates 108a, 108b, heat insulator 110, and TIM elements 116a, 116b collectively form an air flap rotator 117 configured to rotate air flap 114 about an origin point P responsive to a temperature differential between the plates, caused by a temperature differential between heat sources HSa, HSb, as will be described below. In the example of FIG. 1, heat sources HSa and HSb are spaced-apart from each other in the horizontal direction, to leave a horizontal gap between the heat sources. Heat sources HSa, HSb sandwich air flap rotator 117 (e.g., plates 108a, 108b, heat insulator 110, and TIM elements 116a, 116b) between the heat sources. Spring clips (not shown) may be used to fix air flap rotator to heat sources Has, HSb. Thus, plates 108a, 108b are positioned adjacent to heat sources HSa, HSb, respectively. Plates 108a, 108b may be referred to as opposing spaced-apart plates positioned adjacent to opposing heat sources HSa, HSb (and/or regions Ra, Rb), respectively. Air flap rotator 117 fills the gap and therefore blocks any airflow from traversing the gap, which maximizes control of the airflow by air flap 114 alone. TIM elements 116a, 116b, sandwiched between plates 108a, 108b and heat sources HSa, HSb, respectively, maximize thermal coupling between the heat sources and the plates, respectively, to ensure that the temperatures of the plates accurately reflect corresponding temperatures of their adjacent heat sources.

Operation of dynamic air baffle 106 is now described. The configuration of FIG. 1 corresponds to a first scenario when heat sources HSa, HSb are at (i.e., have) the same temperature. When heat sources HSa, HSb are at the same temperature, plates 108a, 108b are also at the same temperature, i.e., the temperatures of the plates are equal. Therefore, the differential temperature between plates 108a, 108b is zero. When the differential temperature between plates 108a, 108b is zero, the differential expansion between the lengths La, Lb is zero, i.e., the lengths La, Lb are equal. Because hinge 112 is coupled to front ends 120a, 120b of plates 108a, 108b, their equal lengths (La, Lb) maintain hinge 112 in an unrotated rest position, as shown in FIG. 1. In turn, hinge 112 maintains air flap 114 in an unrotated rest position (also referred to as a "middle position") such that the air flap extends normally (i.e., at a right angle) away from a face of the hinge and directly into the airflow. The unrotated rest position of air flap 114 aligns the air flap with a center vertical axis that bisects dynamic air baffle 106. In the unrotated rest position (referred to simply as the "rest position"), air flap 114 partitions or divides the airflow equally between the left and right sides of the air flap, and thereby directs an equal amount of the airflow to (i) plate 108a and heat source HSa corresponding to the left side of the air flap, and (ii) plate 108b and heat source HSb corresponding to the right side of the air flap.

With reference to FIG. 2, there is an illustration of system 100 corresponding to a second scenario when there is a non-zero differential temperature between heat sources HSa, HSb. In the second scenario, heat source HSa is hotter than HSb, i.e., HSa is at a higher temperature than heat source HSb. Therefore, heat sources HSa and HSb may be referred to as "hotter" and "cooler" heat sources, respectively, where the cooler heat source is lower in temperature than the hotter heat source. The non-zero differential temperature between heat sources HSa, HSb causes a corresponding non-zero differential temperature between plates 108a, 108b, such that plate 108a becomes hotter (i.e., has a higher temperature) than plate 108b. Thus, plates 108a and 108b may be referred to as the "hotter" and the "cooler" plates.

The non-zero differential temperature of plates 108a, 108b causes a corresponding non-zero differential expansion of lengths La, Lb of the plates. In the example of FIG. 2, length La of hotter plate 108a expands more than length Lb of cooler plate 108b, such that La>Lb by a differential length ΔL (where ΔL=La−Lb). While plates 108a, 108b are spaced-apart in the horizontal direction, the differential expansion (e.g., ΔL) of lengths La, Lb of the plates extends in the vertical direction. Thus, differential length ΔL causes hinge 112 and air flap 114 (carried by the hinge) to rotate away from their unrotated rest positions of FIG. 1 (corresponding to when the differential temperature and the differential expansion in the lengths of plates 108a, 108b are zero) to a rotated position that is closer to cooler plate 108b and heat source HSb, and farther away from hotter plate 108a and heat source HSa, compared to when the air flap occupies the unrotated rest position. As shown in FIG. 2, differential length ΔL causes air flap 114 to rotate leftward (i.e., counterclockwise) away from the center axis about origin point P, through an angle θ that corresponds to the differential length ΔL (and therefore, to the differential temperature between the plates).

When in the rotated position, air flap 114 partitions/directs more of the airflow to hotter plate 108a and heat source HSa and less of the airflow to cooler plate 108b and heat source HSb, compared to when the air flap is in the rest position. Thus, an increase in the differential temperature between plates 108a, 108b causes an increase in the angle θ so as to rotate air flap 114 closer to the cooler plate and farther away from and the hotter plate, thereby increasing the airflow to the hotter plate relative to the cooler hot plate. Conversely, a decrease in the differential temperature between plates 108a, 108b causes a decrease in the angle θ so as to rotate air flap 114 farther away from the cooler plate and closer to the hotter plate, thereby decreasing the airflow to the hotter plate relative to the cooler plate. In the examples of FIGS. 1 and 2, air flap 114 may rotate from the axis by as much as +/−35°, for example, although larger or smaller ranges of angle θ are possible.

Figure 3:
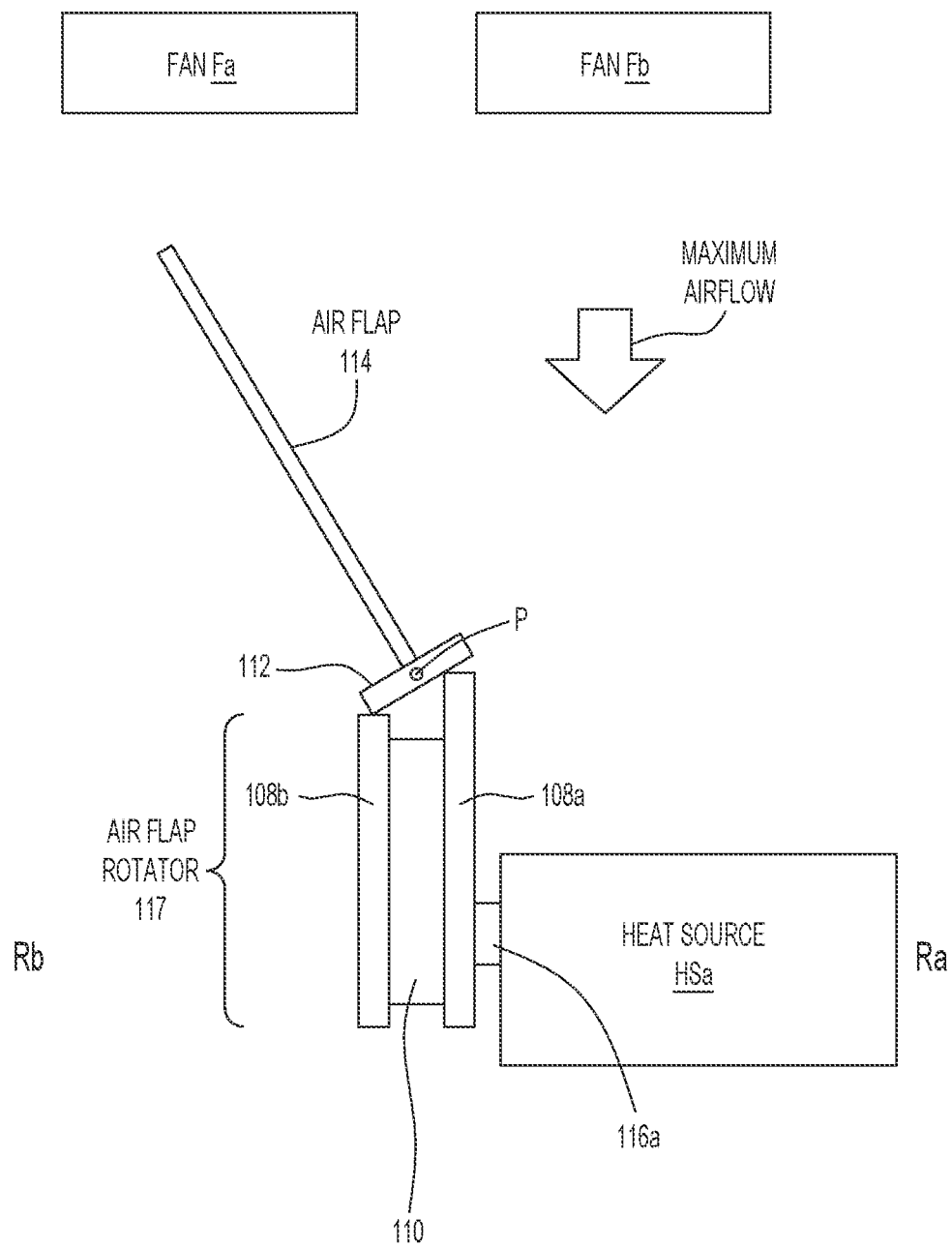
FIG. 3 is a high-level top-down view of the dynamic air baffle configured to control airflow directed to a single heat source positioned adjacent to one side of the dynamic air baffle, accordance to an example embodiment.

With reference to FIG. 3, there is a block diagram of an alternative system 300 that employs dynamic air baffle 106 to control the airflow to a single heat source. Alternative system 300 is similar to system 100, except that alternative system 300 includes only heat source HSa positioned adjacent to plate 108a in region Ra, and omits heat source HSb from region Rb adjacent to plate 108b. In alternative system 300, TIM element 116b of dynamic air baffle 106 may also be omitted. In alternative system 300, dynamic air baffle 106 operates similarly to the way the dynamic air baffle operates in system 100, except that in alternative system 300 the temperature differential between plates 108a, 108b arises from a corresponding temperature differential between heat source HSa and empty/unoccupied region Rb. FIG. 3 corresponds to a scenario in which plate 108a is hotter than region Rb.

In the example of FIG. 3, an increase in the differential temperature between plates 108a, 108b causes an increase in angle θ so as to rotate air flap 114 closer to the cooler one of plates 108a, 108b and farther away from the hotter one of the plates, thereby increasing the airflow to the hotter one of the plates. Conversely, a decrease in the differential temperature between plates 108a, 108b causes a decrease in angle θ so as to rotate air flap 114 farther away from the cooler one of the plates and closer to the hotter one of the plates, thereby decreasing the airflow to the hotter one of the plates relative to the cooler one of the plates. When the differential temperature between plates 108a, 108b is zero due to a corresponding zero differential temperature between the plates, equal lengths La, Lb maintain air flap 114 in the rest position, where angle θ is zero.

Generally, in system 100 and alternative system 300, dynamic air baffle 106 includes spaced-apart plates 108a, 108b positioned adjacent to spaced-apart regions Ra, Rb, respectively, to be cooled by fans Fa, Fb directing an airflow to the regions. In one embodiment (e.g., system 100), both regions are occupied by respective heat sources. In another embodiment (e.g., alternative system 300), only one of the regions is occupied by a heat source. Dynamic air baffle further includes heat insulator 110 sandwiched between plates 108a, 108b, and further includes air flap 114 rotatively coupled to ends of the plates (via hinge 112) and extending into the airflow to partition the airflow between opposing sides of the air flap. Dynamic air baffle 106 is configured such that a non-zero differential temperature between plates 108a, 108b (that results from a non-zero differential temperature of the regions) causes a non-zero differential expansion in lengths La, Lb of the plates, which in turn rotates air flap 114 from a rest position, corresponding to when the differential temperature and the differential expansion in the lengths La, Lb of the plates are all zero, to a rotated position that is closer to a relatively cooler plate and farther from a relatively hotter plate of the plates, such that the air flap directs more of the airflow to the hotter plate (and its adjacent hotter region) and less of the airflow to the cooler plate (and its adjacent cooler region) compared to when the air flap is in the rest position.

Figure 4:
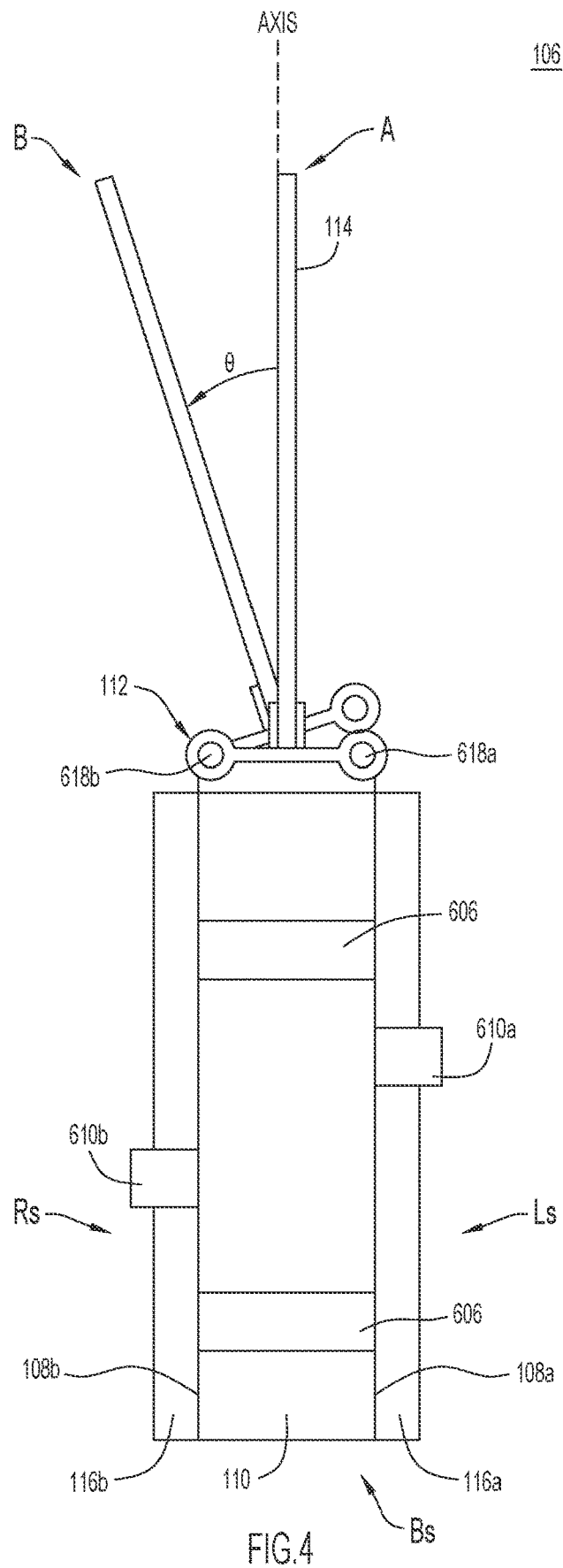
FIG. 4 is a detailed top-down view of the dynamic air baffle, according to an example embodiment.
Figure 5:
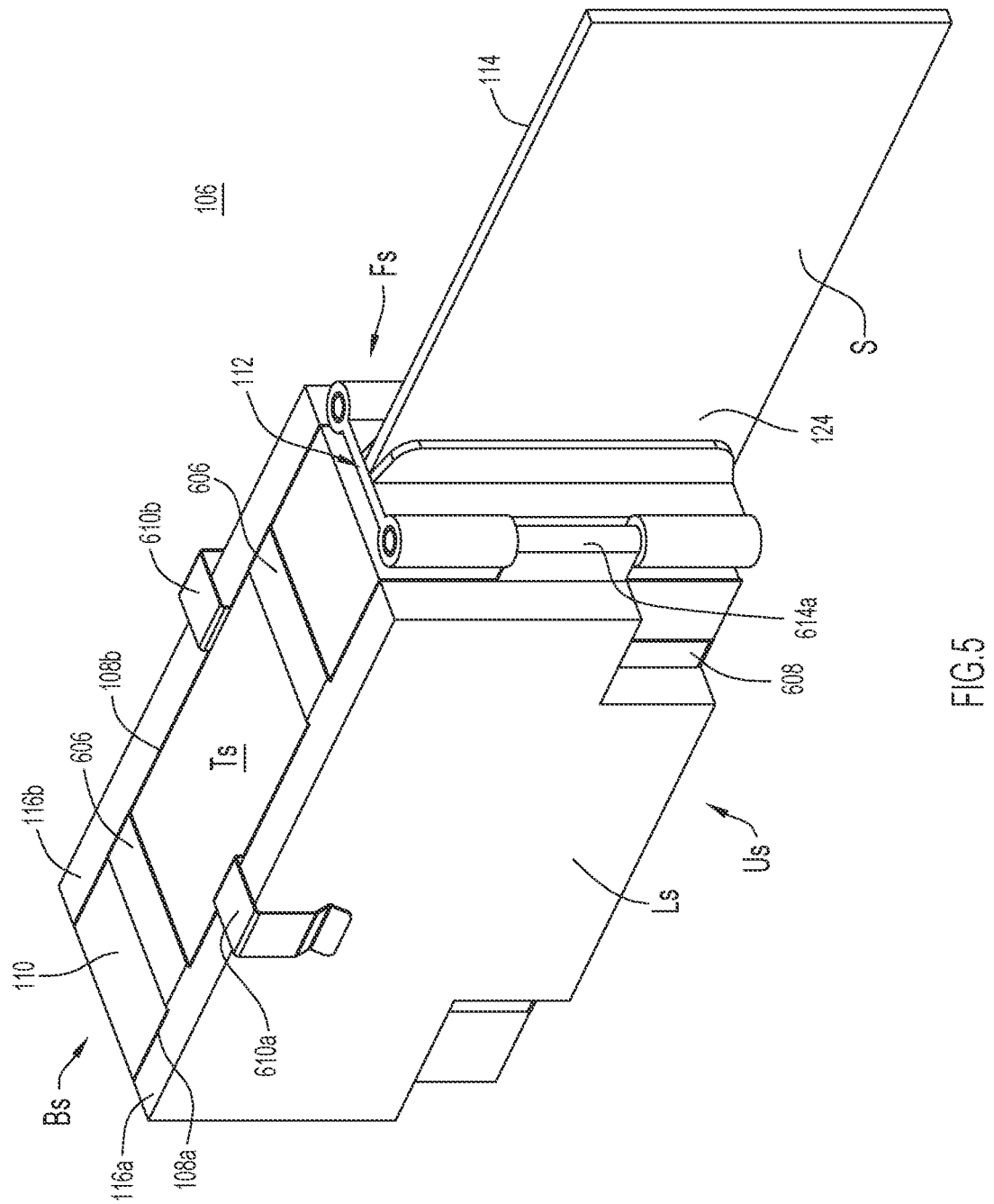
FIG. 5 is a perspective view of the dynamic air baffle, according to an example embodiment.
Figure 6:
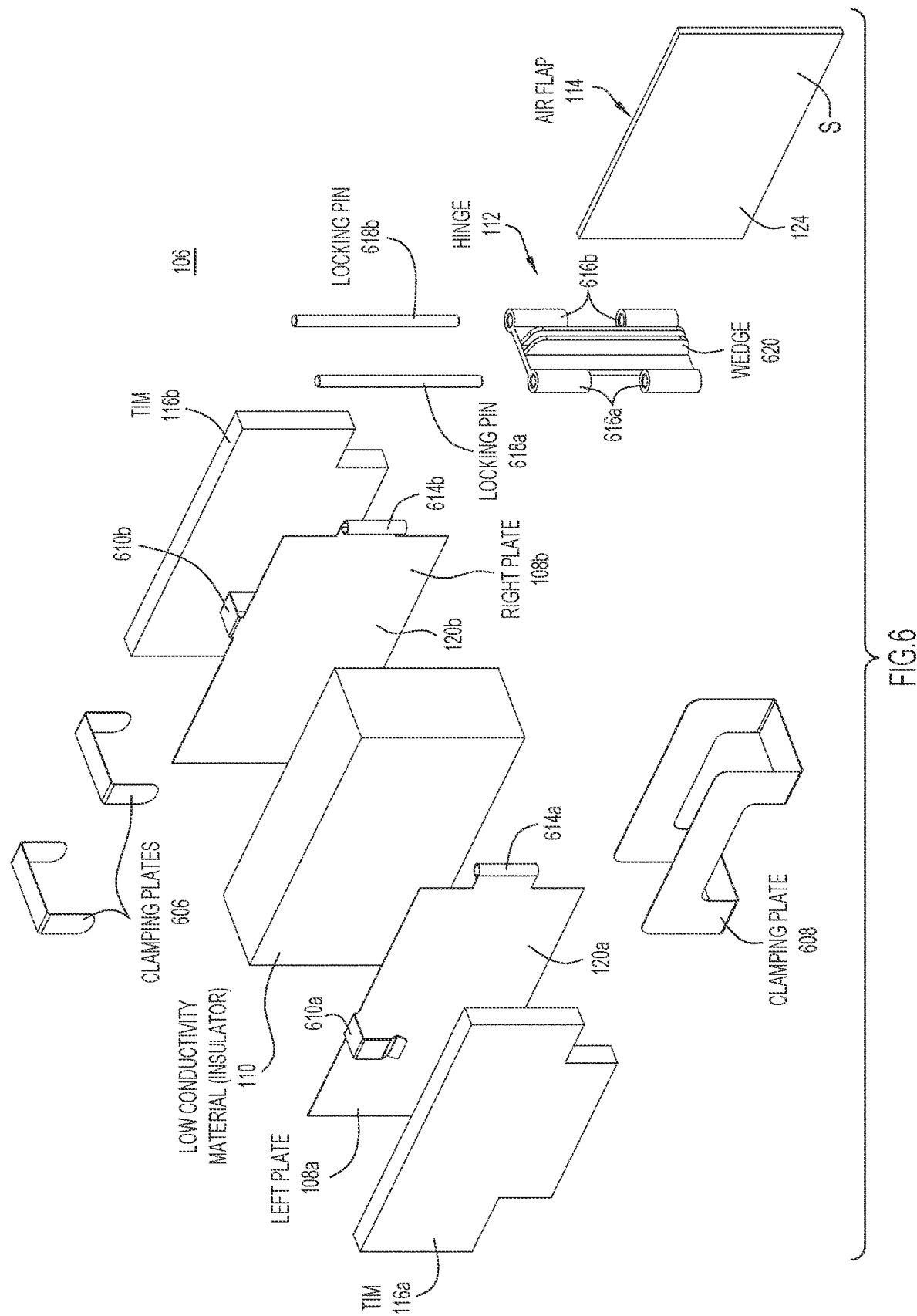
FIG. 6 is an exploded or deconstructed perspective view of the elements or components of the dynamic air baffle, according to an example embodiment.

Further construction details of dynamic air baffle 106 are shown in FIGS. 4-7, described below. FIG. 4 is a detailed top-down view of dynamic air baffle 106. FIG. 5 is a perspective view of dynamic air baffle 106. FIG. 6 is an exploded or deconstructed perspective view of dynamic air baffle 106. Referring to FIGS. 4-6, dynamic air baffle 106 includes the following substantially planar coextensive (area) elements stacked together side-by-side in a horizontal or width direction, in the following order: TIM element 116a; plate 108a (depicted as a substantially planar sheet metal plate in FIG. 6); heat insulator 110; plate 108b (also depicted as a substantially planar sheet metal plate); and TIM element 116b. The aforementioned "stacked elements" form a substantially parallelopiped shape having substantially planar faces or sides, including opposing front and back sides Fs, Bs spaced apart in the vertical or length direction (see FIG. 5), opposing left and right sides Ls, Rs spaced apart in the horizontal or width direction (see FIG. 4), and opposing top and bottom/lower sides Ts, Us spaced apart in a vertical or height direction. Dynamic air baffle 106 includes top and bottom U-clamps or spring clips 606, 608 to clamp plates 108a, 108b to opposing sides of heat insulator 110. Plates 108a, 108b include respective U-clamps or spring clips 610a, 610b to clamp TIM elements 116a, 116b to the plates. The aforementioned clamps may be made of any suitable sheet metal, for example.

Plates 108a, 108b are fixed or coupled to hinge 112 in the following manner. Front ends 120a, 120b of plates 108a, 108b (see FIG. 6) have extended center portions formed with respective vertically-directed locking-pin receptacles 614a, 614b (i.e., the locking-pin receptacles extend in the vertical or height direction). Hinge 112 extends across front side Fs of the stacked elements and terminates at spaced-apart left and right sides of the hinge that coincide with front ends 120a and 120b of plates 108a and 108b, respectively. The left side of hinge 112 is formed with a pair of vertically-directed and aligned spaced-apart locking-pin receptacles 616a that are vertically aligned with, and straddle, locking-pin receptacle 614a of plate 108a. Similarly, the right side of hinge 112 is formed with a pair of vertically-directed and aligned spaced-apart locking-pin receptacles 616b that are vertically aligned with, and straddle, locking-pin receptacle 614b of plate 108b. Vertically-aligned left and right sets of (plate, hinge) locking-pin receptacles (614a, 616a) and (614b, 616b) receive left and right locking pins 618a and 618b, respectively, to couple hinge 112 to plates 108a, 108b.

Hinge 112 is coupled to air flap 114 in the following manner. Hinge 112 has a middle portion (between the left and right sides of the hinge) formed with a vertical wedge 620 (see FIG. 6) that defines a vertical slot. The vertical slot of hinge 112 receives, and is fixed to, fixed end 124 of air flap 114, while air flap side S extends away from the fixed end. Therefore, rotation of hinge 112 about origin point P causes a corresponding rotation of air flap 114 away from the center axis, as shown in FIG. 4. FIG. 4 depicts hinge 112 and air flap 114 in (i) the unrotated rest or middle position A when lengths La, Lb are equal, and (ii) the rotated position B when length La>Lb.

Figure 7:
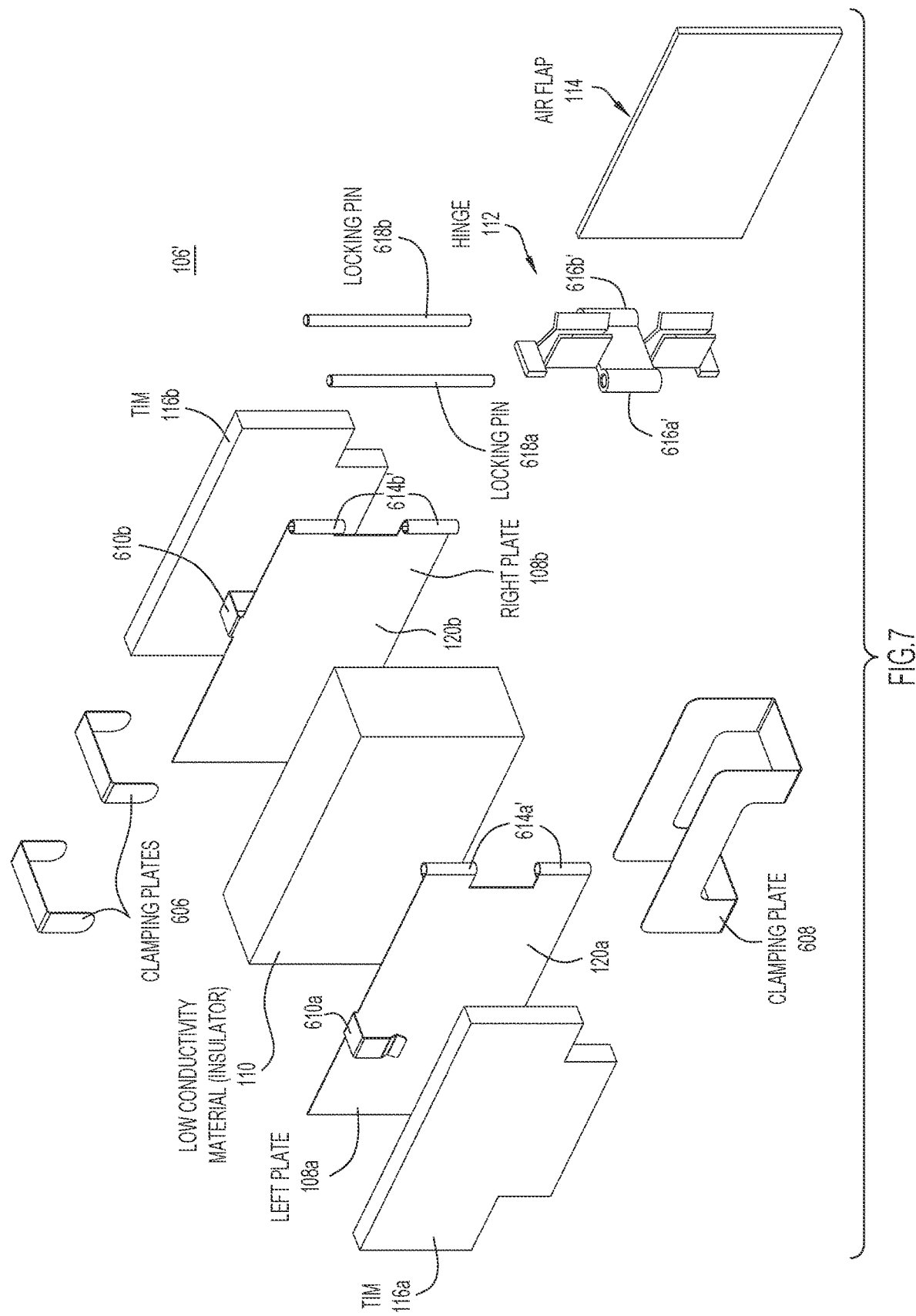
FIG. 7 is an exploded or deconstructed perspective view of the dynamic air baffle, according to an alternative example embodiment.

FIG. 7 is an exploded or deconstructed perspective view of a dynamic air baffle 106' according to an alterative embodiment. Dynamic air baffle 106' is similar to dynamic air baffle 106 except that the hinge-plate coupling structure of dynamic air baffle 106' differs slightly from that of dynamic air baffle 106. More specifically, in the example of FIG. 7, plates 108a, 108b (instead of hinge 112) include respective pairs of spaced-apart locking-pin receptacles 614a', 614b', and left and right sides of hinge 112 include respective single locking-pin receptacles 616a', 616b'.

Figure 8:
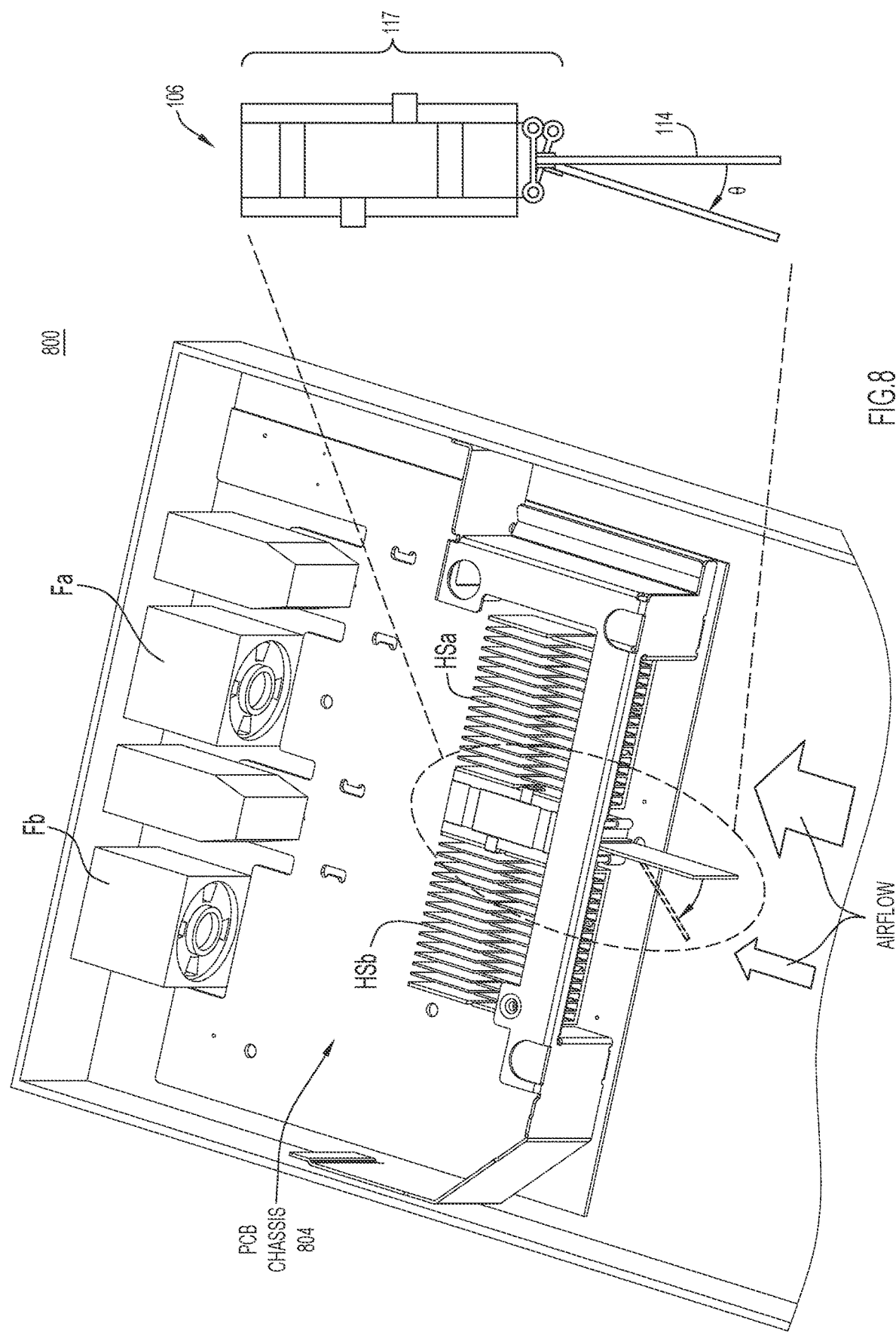
FIG. 8 is a perspective view of a system that employs the dynamic air baffle, according to an example embodiment.

With reference to FIG. 8, there is a perspective view of a system 800 that employs dynamic air baffle 106, according to an alternative arrangement. System 800 includes fans Fa, Fb, heat sources HSa, HSb, and dynamic air baffle 106 mounted to printed circuit board (PCB) chassis 804. In system 800, dynamic air baffle 106 is sandwiched between heat sources HSa, HSb, similar to system 100. However, fans Fa, Fb draw the airflow into system 800 and away from dynamic air baffle 106 and heat sources HSa, HSb, i.e., the direction of the airflow in system 800 is opposite to the direction of the airflow in system 100 relative to the positions of dynamic air baffle 106 and heat sources HSa, HSb. Accordingly, in system 800, dynamic air baffle 106 is rotated 180 degrees with respect to its orientation in system 100 to ensure that air flap 114 is pointing in a direction opposite to the direction of the airflow (i.e., the air flap points into the airflow being draw into system 800 by fans Fa, Fb). Dynamic air baffle 106 operates essentially the same way in system 800 as in system 100. Although two fans and two heat sources are shown, more or less fans and heat sources may be used.

With reference to FIG. 9, there is a flowchart of an example method 900 of controlling airflow using dynamic air baffle 106. Operations of method 900 are described above.

Operation 902 includes providing a dynamic air baffle having first (e.g., left) and second (e.g., right) plates spaced-apart from each other, arranged in parallel with each other, and configured to be positioned adjacent to first and second regions to be cooled by an airflow. The first and second regions may be occupied by first and second heat sources, respectively. Alternatively, only one of the regions may be occupied by a single heat source. The dynamic air baffle further includes a heat insulator sandwiched between the first and second plates, a hinge fixed to respective ends of the first and second plates, and an air flap coupled to the hinge and including an air flap extending into the airflow to partition the airflow. The hinge is configured to rotate responsive to the differential expansion in lengths of the first and second plates.

Operation 904 includes, by the dynamic air baffle, responsive to a non-zero differential temperature between the first and second plates (which is responsive to a non-zero differential temperature of the first and second regions) that causes a non-zero differential expansion in lengths of the first and second plates, rotating the air flap from a rest position, corresponding to when the differential temperature and the differential expansion in the lengths of the plates are zero, to a rotated position that is closer to a cooler region and farther from a hotter region of the first and second regions, which results in directing more of the airflow to the hotter region and less of the airflow to the cooler region compared to when the air flap is in the rest position. Moreover, a change in the differential expansion in the lengths responsive to a change in the differential temperature causes a change in an angle through which the air flap rotates, i.e., causes a dynamic rotation of the air flap.

In summary, embodiments presented herein provide a dynamic air baffle that interactively adjusts airflow to heat sources experiencing a temperature disparity. The dynamic air baffle can be used with port side intake (PSI) (i.e., front-to-back) and port side exhaust (PSE) (i.e., back-to-front) airflow, which means the dynamic air baffle represents a generic design that may be installed only once in a bidirectional airflow system, and may be used regardless of airflow direction. The dynamic air baffle lowers system power consumption by lowering the speed of the fan that generates the airflow while keeping adjacent ASIC/CPUs cool by rebalancing the airflow per heat source requirement. The dynamic air baffle is relatively easy to manufacture and install, which can scale up or down depend on the heat sources quantity.

Note that in this Specification, references to various features (e.g., elements, structures, nodes, modules, components, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments.

It is also noted that the operations and steps described with reference to the preceding figures illustrate only some of the possible scenarios that may be executed by one or more components/entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, terms such as first and second, left and right, and upper and lower, are relative and may be used in place of each other. For example, first and left (or right) may be used interchangeably, second and right (or left) may be used interchangeably, first and upper (or lower) may be used interchangeably, and second and lower (or upper) may be used interchangeably. Also, terms such as vertical and horizontal (and their respective derivatives) are used to establish transverse/perpendicular directions/orientations, and terms such as, but not limited to, "first and second directions that are transverse/perpendicular to each other," may be used in place of vertical and horizontal. As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Each example embodiment disclosed herein has been included to present one or more different features. However, all disclosed example embodiments are designed to work together as part of a single larger system or method. This disclosure explicitly envisions compound embodiments that combine multiple previously discussed features in different example embodiments into a single system or method.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

In some aspects, the techniques described herein relate to an apparatus including: first and second plates spaced-apart from each other and configured to be positioned adjacent to at least one heat source to be cooled by an airflow; a heat insulator sandwiched between the first and second plates; and an air flap coupled to ends of the first and second plates and configured to extend into the airflow to partition the airflow; wherein the first and second plates are configured such that a differential temperature between the first and second plates causes a differential expansion in lengths of the first and second plates, which rotates the air flap from a rest position, corresponding to when the differential temperature and the differential expansion in the lengths are both zero, to a rotated position that is closer to a cooler plate and farther from a hotter plate of the first and second plates, such that the air flap directs more of the airflow to the hotter plate and less of the airflow to the cooler plate compared to when the air flap is in the rest position.

In some aspects, the techniques described herein relate to an apparatus, wherein: the rest position of the air flap, which corresponds to when the differential temperature is zero, is a middle position of the air flap that is configured to partition the airflow equally between the first and second plates.

In some aspects, the techniques described herein relate to an apparatus, wherein: a change in the differential expansion in the lengths responsive to a change in the differential temperature causes a change in an angle through which the air flap rotates.

In some aspects, the techniques described herein relate to an apparatus, further including: a hinge fixed to the ends of the first and second plates and configured to rotate responsive to the differential expansion in the lengths of the first and second plates, wherein the air flap includes an end fixed to the hinge and a planar side configured to extend away from the end and into the airflow to partition the airflow, wherein the air flap is configured to rotate with the hinge.

In some aspects, the techniques described herein relate to an apparatus, further including: a thermal interface material element sandwiched between the at least one heat source and one of the first and second plates that is positioned adjacent to the at least one heat source.

In some aspects, the techniques described herein relate to an apparatus, wherein: the first and second plates are configured to be positioned adjacent to first and second heat sources that are spaced-apart from each other; the differential temperature between the first and second plates is in response to a second differential temperature between the first and second heat sources; and responsive to the differential temperature between the first and second plates, the air flap rotates towards the cooler plate and away from the hotter plate so as increase the airflow to a hotter one of the first and second heat sources relative to the airflow directed to a cooler one of the first and second heat sources.

In some aspects, the techniques described herein relate to an apparatus, wherein: the at least one heat source includes a single heat source positioned adjacent to one of the first and second plates; and the differential temperature is due to a temperature of the single heat source.

In some aspects, the techniques described herein relate to an apparatus, wherein: the first and second plates each include a material having a high coefficient of thermal expansion (CTE); and the heat insulator has a low CTE that is lower than the high CTE to reduce heat transfer between the first and second plates.

In some aspects, the techniques described herein relate to an apparatus, wherein: the first and second plates are substantially planar metal plates arranged in parallel with each other.

In some aspects, the techniques described herein relate to an apparatus, wherein: the first and second plates are spaced-apart from each other in a first direction and the differential expansion in the lengths extends in a second direction that is transverse to the first direction.

In some aspects, the techniques described herein relate to an apparatus including: first and second plates spaced-apart from each other and configured to be positioned adjacent to first and second heat sources to be cooled by an airflow; a heat insulator sandwiched between the first and second plates; a hinge fixed to ends of the first and second plates; and an air flap having an end fixed to the hinge and a side configured to extend away from the end and into the airflow to partition the airflow; wherein the first and second plates are configured such that a differential temperature between the first and second plates causes a differential expansion in lengths of the first and second plates, which in turn causes the hinge and the air flap to rotate from a rest position, corresponding to when the differential temperature and the differential expansion in the lengths are both zero, to a rotated position that is closer to a cooler plate of the first and second plates and farther from a hotter plate of the first and second plates, such that the air flap directs more of the airflow to the hotter plate and less of the airflow to the cooler plate compared to the rest position.

In some aspects, the techniques described herein relate to an apparatus, wherein: the rest position of the air flap, which corresponds to when the differential temperature is zero, is configured to partition the airflow equally between the first and second plates.

In some aspects, the techniques described herein relate to an apparatus, wherein: a change in the differential expansion in the lengths responsive to a change in the differential temperature causes a change in an angle through which the air flap rotates towards the cooler plate.

In some aspects, the techniques described herein relate to an apparatus, wherein: the first and second plates are parallel and coextensive with each other.

In some aspects, the techniques described herein relate to an apparatus, wherein: the first and second plates each include a material having a high coefficient of thermal expansion (CTE); and the heat insulator has a low CTE that is lower than the high CTE.

In some aspects, the techniques described herein relate to an apparatus, wherein: the first and second plates are substantially planar metal plates arranged in parallel with each other.

In some aspects, the techniques described herein relate to an apparatus, wherein: the first and second plates are spaced-apart in a first direction and the differential expansion in the lengths extends in a second direction that is transverse to the first direction.

In some aspects, the techniques described herein relate to a method including: providing a dynamic air baffle having: first and second plates spaced-apart from each other and configured to be positioned adjacent to first and second regions to be cooled by an airflow; a heat insulator sandwiched between the first and second plates; an air flap coupled to ends of the first and second plates and extending into the airflow to partition the airflow; and by the dynamic air baffle, responsive to a differential temperature between the first and second plates that causes a differential expansion in lengths of the first and second plates, rotating the air flap from a rest position, corresponding to when the differential temperature and the differential expansion in the lengths are both zero, to a rotated position that is closer to a cooler region and farther from a hotter region of the first and second regions and directing more of the airflow to the hotter region and less of the airflow to the cooler region compared to when the air flap is in the rest position.

In some aspects, the techniques described herein relate to a method, wherein: the rest position of the air flap, which corresponds to when the differential temperature is zero, partitions the airflow equally between the first and second regions.

In some aspects, the techniques described herein relate to a method, wherein: a change in the differential expansion in the lengths responsive to a change in the differential temperature causes rotating of the air flap through an angle.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

Moreover, although the techniques are illustrated and described herein as embodied in one or more specific examples, it is nevertheless not intended to be limited to the details shown, since various modifications and structural changes may be made within the scope and range of equivalents of the claims.

What is claimed is:

1. An apparatus comprising:
   first and second plates spaced-apart from each other and configured to be positioned adjacent to at least one heat source to be cooled by an airflow;
   a heat insulator sandwiched between the first and second plates; and
   an air flap coupled to ends of the first and second plates and configured to extend into the airflow to partition the airflow;
   wherein the first and second plates are configured such that a differential temperature between the first and second plates causes a differential expansion in lengths of the first and second plates, which rotates the air flap from a rest position, corresponding to when the differential temperature and the differential expansion in the lengths are both zero, to a rotated position that is closer to a cooler plate and farther from a hotter plate of the first and second plates, such that the air flap directs more of the airflow to the hotter plate and less of the airflow to the cooler plate compared to when the air flap is in the rest position.

2. The apparatus of claim 1, wherein:
   the rest position of the air flap, which corresponds to when the differential temperature is zero, is a middle position of the air flap that is configured to partition the airflow equally between the first and second plates.

3. The apparatus of claim 1, wherein:
   a change in the differential expansion in the lengths responsive to a change in the differential temperature causes a change in an angle through which the air flap rotates.

4. The apparatus of claim 1, further comprising:
   a hinge fixed to the ends of the first and second plates and configured to rotate responsive to the differential expansion in the lengths of the first and second plates,
   wherein the air flap includes an end fixed to the hinge and a planar side configured to extend away from the end and into the airflow to partition the airflow, wherein the air flap is configured to rotate with the hinge.

5. The apparatus of claim 1, further comprising:
   a thermal interface material element sandwiched between the at least one heat source and one of the first and second plates that is positioned adjacent to the at least one heat source.

6. The apparatus of claim 1, wherein:
   the first and second plates are configured to be positioned adjacent to first and second heat sources that are spaced-apart from each other;
   the differential temperature between the first and second plates is in response to a second differential temperature between the first and second heat sources; and
   responsive to the differential temperature between the first and second plates, the air flap rotates towards the cooler plate and away from the hotter plate so as increase the airflow to a hotter one of the first and second heat sources relative to the airflow directed to a cooler one of the first and second heat sources.

7. The apparatus of claim 1, wherein:
   the at least one heat source includes a single heat source positioned adjacent to one of the first and second plates; and
   the differential temperature is due to a temperature of the single heat source.

8. The apparatus of claim 1, wherein:
   the first and second plates each comprise a material having a high coefficient of thermal expansion (CTE); and
   the heat insulator has a low CTE that is lower than the high CTE to reduce heat transfer between the first and second plates.

9. The apparatus of claim 1, wherein:
   the first and second plates are substantially planar metal plates arranged in parallel with each other.

10. The apparatus of claim 1, wherein:
    the first and second plates are spaced-apart from each other in a first direction and the differential expansion in the lengths extends in a second direction that is transverse to the first direction.

11. An apparatus comprising:
    first and second plates spaced-apart from each other and configured to be positioned adjacent to first and second heat sources to be cooled by an airflow;
    a heat insulator sandwiched between the first and second plates;
    a hinge fixed to ends of the first and second plates; and an air flap having an end fixed to the hinge and a side configured to extend away from the end and into the airflow to partition the airflow;

wherein the first and second plates are configured such that a differential temperature between the first and second plates causes a differential expansion in lengths of the first and second plates, which in turn causes the hinge and the air flap to rotate from a rest position, corresponding to when the differential temperature and the differential expansion in the lengths are both zero, to a rotated position that is closer to a cooler plate of the first and second plates and farther from a hotter plate of the first and second plates, such that the air flap directs more of the airflow to the hotter plate and less of the airflow to the cooler plate compared to the rest position.

12. The apparatus of claim 11, wherein:
the rest position of the air flap, which corresponds to when the differential temperature is zero, is configured to partition the airflow equally between the first and second plates.

13. The apparatus of claim 11, wherein:
a change in the differential expansion in the lengths responsive to a change in the differential temperature causes a change in an angle through which the air flap rotates towards the cooler plate.

14. The apparatus of claim 11, wherein:
the first and second plates are parallel and coextensive with each other.

15. The apparatus of claim 11, wherein:
the first and second plates each comprise a material having a high coefficient of thermal expansion (CTE); and
the heat insulator has a low CTE that is lower than the high CTE.

16. The apparatus of claim 11, wherein:
the first and second plates are substantially planar metal plates arranged in parallel with each other.

17. The apparatus of claim 11, wherein:
the first and second plates are spaced-apart in a first direction and the differential expansion in the lengths extends in a second direction that is transverse to the first direction.

18. A method comprising:
providing a dynamic air baffle having:
first and second plates spaced-apart from each other and configured to be positioned adjacent to first and second regions to be cooled by an airflow;
a heat insulator sandwiched between the first and second plates; and
an air flap coupled to ends of the first and second plates and extending into the airflow to partition the airflow; and by the dynamic air baffle, responsive to a differential temperature between the first and second plates that causes a differential expansion in lengths of the first and second plates, rotating the air flap from a rest position, corresponding to when the differential temperature and the differential expansion in the lengths are both zero, to a rotated position that is closer to a cooler region and farther from a hotter region of the first and second regions and directing more of the airflow to the hotter region and less of the airflow to the cooler region compared to when the air flap is in the rest position.

19. The method of claim 18, wherein:
the rest position of the air flap, which corresponds to when the differential temperature is zero, partitions the airflow equally between the first and second regions.

20. The method of claim 18, wherein:
a change in the differential expansion in the lengths responsive to a change in the differential temperature causes rotating of the air flap through an angle.

* * * * *